United States Patent
Ikeda et al.

(10) Patent No.: US 10,805,563 B2
(45) Date of Patent: Oct. 13, 2020

(54) SOLID STATE IMAGING DEVICE HAVING A CHARGE DRAINING MECHANISM

(71) Applicant: CANON KABUSHIKI KAISHA, Tokyo (JP)

(72) Inventors: Hajime Ikeda, Yokohama (JP); Masahiro Kobayashi, Tokyo (JP); Hiroshi Sekine, Kawasaki (JP); Yusuke Onuki, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 69 days.

(21) Appl. No.: 16/040,144

(22) Filed: Jul. 19, 2018

(65) Prior Publication Data

US 2019/0037161 A1 Jan. 31, 2019

(30) Foreign Application Priority Data

Jul. 28, 2017 (JP) .................................. 2017-146694

(51) Int. Cl.
*H04N 5/335* (2011.01)
*H04N 5/3745* (2011.01)
(Continued)

(52) U.S. Cl.
CPC ....... *H04N 5/37452* (2013.01); *H01L 27/146* (2013.01); *H01L 27/14603* (2013.01);
(Continued)

(58) Field of Classification Search
CPC ............. H04N 5/37452; H04N 5/3594; H04N 5/3591; H04N 5/3592; H01L 27/14603;
(Continued)

(56) References Cited

U.S. PATENT DOCUMENTS 7,462,810 B2  12/2008  Kobayashi
7,928,477 B2  4/2011  Kobayashi
(Continued)

FOREIGN PATENT DOCUMENTS

JP   H5-336453 A   12/1993
JP   2004-023097 A   1/2004
(Continued)

OTHER PUBLICATIONS

U.S. Appl. No. 16/008,643, filed Jun. 14, 2018, by Masahiro Kobayashi et al.
(Continued)

*Primary Examiner* — Usman A Khan
(74) *Attorney, Agent, or Firm* — Venable LLP

(57) ABSTRACT

According to an aspect of the present invention, provided is a solid state imaging device including a plurality of pixels, and each of the pixels has a charge accumulation region of a first conductivity type that accumulates signal charges corresponding to an incident light, a drain region of the first conductivity type to which a predetermined voltage is applied, a drain gate located between the drain region and the charge accumulation region in a planar view, and a semiconductor region of the first conductivity type connected to the charge accumulation region and the drain region.

16 Claims, 11 Drawing Sheets

(51) Int. Cl.
*H01L 27/146* (2006.01)
*H04N 5/359* (2011.01)

(52) U.S. Cl.
CPC ..... *H01L 27/14656* (2013.01); *H04N 5/3591* (2013.01); *H04N 5/3592* (2013.01)

(58) Field of Classification Search
CPC ......... H01L 27/14609; H01L 27/14623; H01L 27/14643; H01L 27/146
USPC ....................................................... 348/308
See application file for complete search history.

(56) References Cited

U.S. PATENT DOCUMENTS

| | | | |
|---|---|---|---|
| 7,935,995 | B2 | 5/2011 | Watanabe |
| 8,045,034 | B2 | 10/2011 | Shibata |
| 8,063,351 | B2 | 11/2011 | Kobayashi |
| 8,115,848 | B2 | 2/2012 | Onuki |
| 8,174,604 | B2 | 5/2012 | Shibata |
| 8,222,682 | B2 | 7/2012 | Watanabe |
| 8,259,206 | B1 | 9/2012 | Shibata |
| 8,289,432 | B2 | 10/2012 | Shibata |
| 8,357,956 | B2 | 1/2013 | Kobayashi |
| 8,427,564 | B2 | 4/2013 | Yamashita |
| 8,456,559 | B2 | 6/2013 | Yamashita |
| 8,552,353 | B2 | 10/2013 | Kobayashi |
| 8,723,232 | B2 | 5/2014 | Kobayashi |
| 8,736,734 | B2 | 5/2014 | Onuki |
| 8,810,703 | B2 | 8/2014 | Machida |
| 8,884,391 | B2 | 11/2014 | Fudaba |
| 9,147,708 | B2 | 9/2015 | Okita |
| 9,153,610 | B2 | 10/2015 | Kobayashi |
| 9,276,027 | B2 | 3/2016 | Okita |
| 9,344,653 | B2 | 5/2016 | Shimotsusa |
| 9,419,038 | B2 | 8/2016 | Kobayashi |
| 9,445,026 | B2 | 9/2016 | Kobayashi |
| 9,538,112 | B2 | 1/2017 | Wada |
| 9,548,328 | B2 | 1/2017 | Hasegawa |
| 9,716,849 | B2 | 7/2017 | Kobayashi |
| 9,768,213 | B2 | 9/2017 | Soda |
| 9,818,794 | B2 | 11/2017 | Okita |
| 9,876,975 | B2 | 1/2018 | Yoshida |
| 9,894,295 | B2 | 2/2018 | Kawabata |
| 9,906,743 | B2 | 2/2018 | Shimotsusa |
| 10,009,560 | B2 | 6/2018 | Kobayashi |
| 10,021,321 | B2 | 7/2018 | Kawabata |
| 10,057,519 | B2 | 8/2018 | Kobayashi |
| 2001/0000068 | A1* | 3/2001 | Isogai ............... H01L 27/14609 257/443 |
| 2003/0230771 | A1 | 12/2003 | Lee |
| 2004/0051801 | A1 | 3/2004 | Iizuka et al. |
| 2013/0206965 | A1 | 8/2013 | Yamashita |
| 2014/0061436 | A1 | 3/2014 | Kobayashi |
| 2016/0037086 | A1* | 2/2016 | Kimura ................ H04N 5/2258 348/240.2 |
| 2016/0322406 | A1 | 11/2016 | Kobayashi |
| 2017/0078557 | A1 | 3/2017 | Kawabata |
| 2017/0078604 | A1 | 3/2017 | Kobayashi |
| 2017/0212221 | A1 | 7/2017 | Goden |
| 2017/0294470 | A1 | 10/2017 | Takami |
| 2017/0359538 | A1 | 12/2017 | Kobayashi |
| 2018/0026073 | A1 | 1/2018 | Tsuboi |
| 2018/0098013 | A1 | 4/2018 | Yoshida |
| 2018/0131885 | A1 | 5/2018 | Shimotsusa |
| 2018/0151616 | A1 | 5/2018 | Sekine |
| 2018/0213167 | A1 | 7/2018 | Miki |
| 2018/0213169 | A1 | 7/2018 | Onuki |

FOREIGN PATENT DOCUMENTS

| | | |
|---|---|---|
| JP | 2004-111590 A | 4/2004 |
| JP | 2006-121140 A | 5/2006 |
| JP | 2011-216970 A | 10/2011 |

OTHER PUBLICATIONS

U.S. Appl. No. 15/914,505, filed Mar. 7, 2018, by Hajime Ikeda et al.

U.S. Appl. No. 15/955,146, filed Apr. 17, 2018, by Takeru Ohya et al.

U.S. Appl. No. 16/013,166, filed Jun. 20, 2018, by Junji Iwata et al.

* cited by examiner

SOLID STATE IMAGING DEVICE HAVING A CHARGE DRAINING MECHANISM

BACKGROUND OF THE INVENTION

Field of the Invention

The present invention relates to a solid state imaging device.

Description of the Related Art

In recent digital still cameras and digital video cameras, a CMOS image sensor that consumes less power and operates at a high speed is widely used. A typical CMOS image sensor performs a so-called rolling shutter operation that reads out a pixel sequentially on a row basis. On the other hand, in Japanese Patent Application Laid-Open No. 2006-121140 and Japanese Patent Application Laid-Open No. 2011-216970, for example, a CMOS image sensor that performs a global shutter operation that reads out all of the pixels at the same time is proposed.

In a pixel disclosed in Japanese Patent Application Laid-Open No. 2006-121140 and Japanese Patent Application Laid-Open No. 2011-216970, a charge draining mechanism for draining signal charges accumulated in a photoelectric conversion unit is provided in the pixel to perform the global shutter operation. In particular, in Japanese Patent Application Laid-Open No. 2006-121140, signal charges overflowing from the photoelectric conversion unit are drained via a region of a low impurity concentration. Further, in Japanese Patent Application Laid-Open No. 2011-216970, a MOS transistor is controlled to enable switching on and off of the charge draining mechanism.

In the global shutter operation, it is important to appropriately control a potential barrier of a charge draining path in the charge draining mechanism in order to control a signal charge accumulation period (exposure period). If the potential barrier of the charge draining path is not appropriately controlled, the signal charges overflowing from the photoelectric conversion unit will be drained to a charge holding portion or the like resulting in a reduced SN ratio of a pixel signal. In Japanese Patent Application Laid-Open No. 2006-121140 and Japanese Patent Application Laid-Open No. 2011-216970, no consideration has been made on specific structure and method for the pixel for controlling the charge draining mechanism.

SUMMARY OF THE INVENTION

According to an aspect of the present invention, provided is a solid state imaging device including a plurality of pixels, and each of the pixels has a charge accumulation region of a first conductivity type that accumulates signal charges corresponding to an incident light, a drain region of the first conductivity type to which a predetermined voltage is applied, a drain gate located between the drain region and the charge accumulation region in a planar view, and a semiconductor region of the first conductivity type connected to the charge accumulation region and the drain region.

Further features of the present invention will become apparent from the following description of exemplary embodiments with reference to the attached drawings.

DESCRIPTION OF THE EMBODIMENTS

Figure 1:
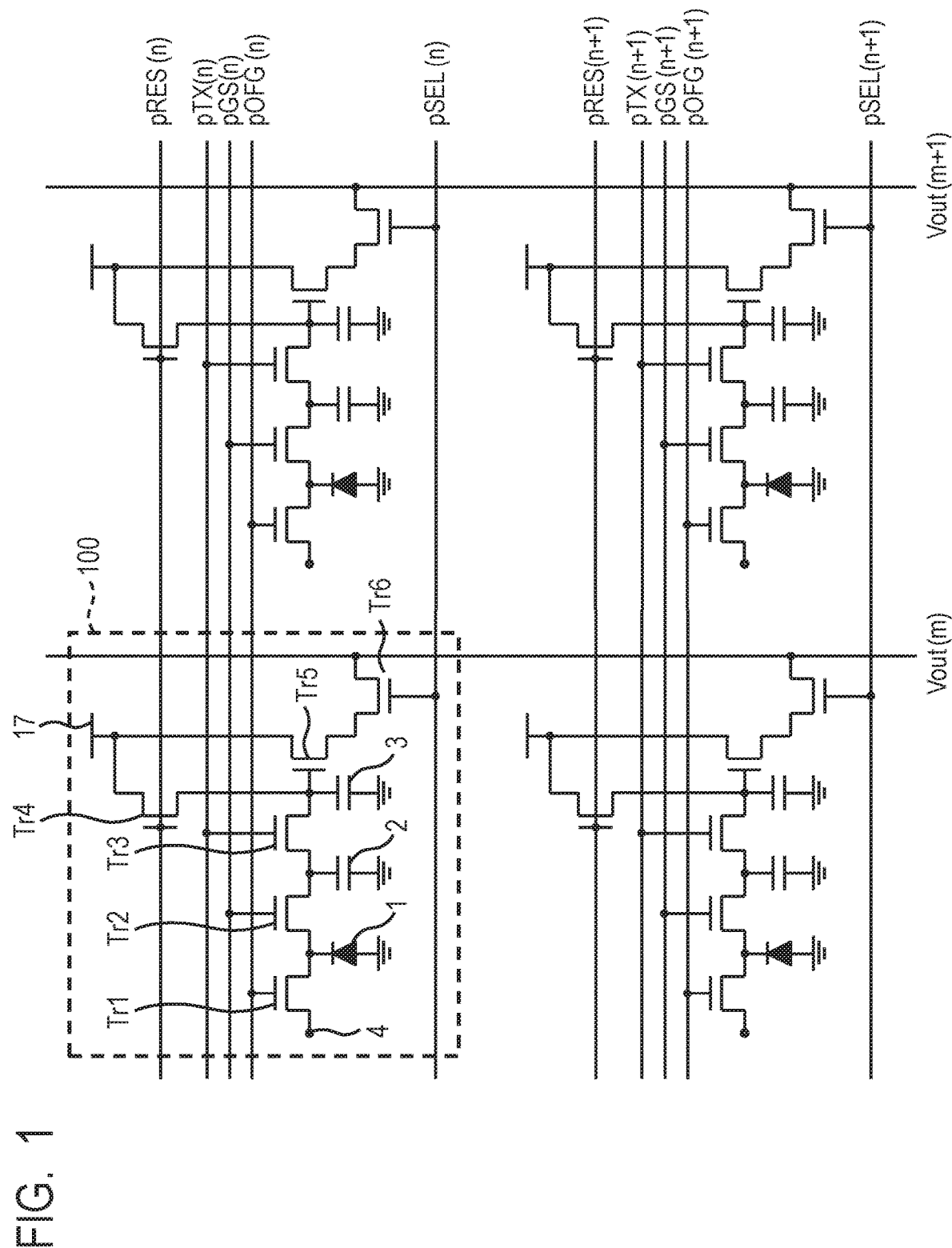
FIG. 1 is an equivalent circuit diagram of pixels in a solid state imaging device according to a first embodiment.

Preferred embodiments of the present invention will now be described in detail in accordance with the accompanying drawings. Note that the present invention is not limited to the following embodiments and can be appropriately modified within a scope not departing from the spirit thereof. Components having the same or corresponding functions in the respective drawings are labeled with a common reference numeral, and the description thereof may be omitted or simplified.

As described above, a charge draining mechanism for draining signal charges accumulated in a photoelectric conversion unit is provided in a pixel and is combined with a charge transfer unit that functions as a global shutter, and thereby an accumulation period of the signal charges in performing the global shutter operation can be controlled. However, there is a problem that, if a potential barrier of a charge draining path is not appropriately controlled, the signal charges overflowing from a photoelectric conversion unit will be drained to a charge holding portion or the like resulting in a reduced SN ratio of a pixel signal.

Therefore, the inventors have studied the structure and the method of a charge draining mechanism suitable for the global shutter operation. A result of the study indicates that the following two requirements are particularly important for suitably controlling the potential barrier of the charge draining path when performing the global shutter operation.

The first requirement is that, during a charge draining period in which signal charges accumulated in the photoelectric conversion unit are drained, the potential of the charge draining path is lower than the potential of the photoelectric conversion unit in a depletion state. Here, the potential refers to potential energy of signal charges, and the signal charges move to a lower potential regardless of the polarity. When the charge draining mechanism satisfies the first requirement, all the signal charges accumulated in the photoelectric conversion unit can be drained during charge draining, and thus there is no variation in the amount of charges in the photoelectric conversion unit after charge draining, and the SN ratio of pixel signals can be improved.

The second requirement is that, during a charge accumulation period in which signal charges accumulated in the photoelectric conversion unit, a potential barrier of the charge draining mechanism is lower than a potential barrier of a charge transfer unit that functions as the global shutter. If the charge draining mechanism satisfies the second requirement, signal charges overflowing from the photoelectric conversion unit are drained not to the charge transfer unit but to a drain region (overflow drain) via the charge draining mechanism. Thereby, generation of a false signal by inflow of overflowing signal charges into the charge holding portion or the like can be suppressed.

The charge draining mechanisms disclosed in Japanese Patent Application Laid-Open No. 2006-121140 and Japanese Patent Application Laid-Open No. 2011-216970 do not satisfy at least one of these two requirements. For example, in Japanese Patent Application Laid-Open No. 2006-121140, no element for switching on and off the charge draining mechanism is provided, and thus the first requirement is not satisfied. Further, in Japanese Patent Application Laid-Open No. 2011-216970, an appropriate size of the potential barrier of the charge draining path is not considered, and thus the second requirement is not satisfied. In the following embodiments, a charge draining mechanism that is suitable for the global shutter operation and satisfies the above two requirements will be described.

First Embodiment

FIG. 1 is an equivalent circuit diagram of pixels 100 in a solid state imaging device according to a first embodiment. Although the solid state imaging device that has four pixels 100 of the n-th to (n+1)-th rows by the m-th to (m+1)-th columns is illustrated in a simplified form in FIG. 1, the actual solid state imaging device has more pixels 100. Each of the pixels 100 has each region of a photoelectric conversion unit 1, a charge holding portion 2, a floating diffusion region 3, and a drain region 4. Further, each of the pixels 100 has each transistor of a charge draining unit Tr1, charge transfer units Tr2 and Tr3, a charge reset unit Tr4, an amplification unit Tr5, and a row selection unit Tr6.

Transistors of the charge draining unit Tr1, the charge transfer units Tr2 and Tr3, the charge reset unit Tr4, and the row selection unit Tr6 are driven by control signals pOFG, pGS, pTX, pRES, and pSEL, respectively. These control signals are output from a vertical scanning circuit (not illustrated) on a row basis. In FIG. 1, row numbers of the control signals output to the pixel 100 are denoted in parentheses.

The photoelectric conversion unit 1 converts an incident light to signal charges and accumulates the signal charges. At this time, the photoelectric conversion unit 1 photoelectrically converts and accumulates the signal charges approximately proportional to the incident light amount. The charge draining unit Tr1 is driven by the control signal pOFG and drains the signal charges accumulated in the photoelectric conversion unit 1 to the drain region 4. The drain region 4 may be connected to a power source 17. The charge transfer unit Tr2 is driven by the control signal pGS and transfers the signal charges accumulated in the photoelectric conversion unit 1 to the charge holding portion 2. The charge transfer unit Tr2 functions as the global shutter for synchronizing the charge accumulation periods in all the pixels 100.

The charge holding portion 2 holds the signal charges transferred from the photoelectric conversion unit 1. The charge transfer unit Tr3 is driven by the control signal pTX and transfers the signal charges held in the charge holding portion 2 to the floating diffusion region 3. In the floating diffusion region 3, the signal charges transferred from the charge holding portion 2 are temporarily held. The floating diffusion region 3 is connected to the input node of the amplification unit Tr5 and functions as a charge voltage conversion portion that converts the temporarily held signal charges to a voltage signal.

The charge reset unit Tr4 is driven by the control signal pRES and resets the floating diffusion region 3 to an electric potential based on the power source 17. In this case, the charge holding portion 2 can be reset by turning on the charge transfer unit Tr3 simultaneously. The photoelectric conversion unit 1 can also be reset by further turning on the charge transfer unit Tr2 simultaneously. The amplification unit Tr5 outputs a pixel signal based on the signal charges transferred to the floating diffusion region 3. The row selection unit Tr6 is driven by the control signal pSEL, selects the pixel 100 to be connected to an output line, and outputs a pixel signal Vout to the output line.

Figure 2:
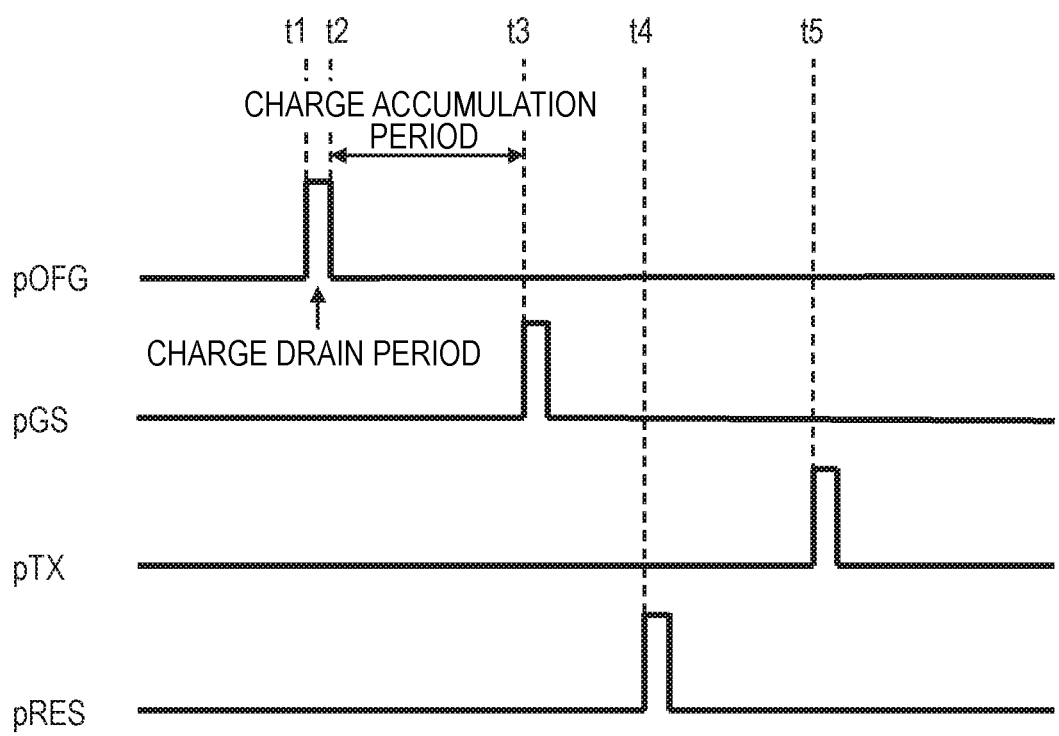
FIG. 2 is a timing chart illustrating a control method of the pixels in the solid state imaging device according to the first embodiment.

FIG. 2 is a timing chart illustrating a control method of the pixels 100 in the solid state imaging device according to the first embodiment. At the time t1, the solid state imaging device controls the control signal pOFG to High. Thereby, the charge draining unit Tr1 is switched to an on-state, and the signal charges accumulated in the photoelectric conversion unit 1 are drained to the drain region 4. In this case, it is desirable that all the signal charges accumulated in the photoelectric conversion unit 1 be drained. When there are charges that are not transferred and remain in the photoelectric conversion unit 1, these charges are added to the signal charges and causes output variation of pixel signals.

At the time t2, the solid state imaging device controls the control signal pOFG to Low. Thereby, the charge draining unit Tr1 is switched to an off-state, and at the same time as the end of the charge draining period of the pixels 100, the signal charges are accumulated in the photoelectric conversion unit 1, and a charge accumulation period of the pixels 100 starts. The amount of the signal charges accumulated in the photoelectric conversion unit 1 is approximately proportional to the amount of an incident light to the photoelectric conversion unit 1 and the length of a charge accumulation period.

At the time t3, the solid state imaging device controls the control signal pGS to High. Thereby, the charge transfer unit Tr2 is switched to an on-state, the signal charges accumulated in the photoelectric conversion unit 1 are transferred to the charge holding portion 2, and the charge accumulation period of the pixels 100 ends. Then, the solid state imaging device controls the control signal pGS back to Low. The period from the time t2 to the time t3 is defined as a charge accumulation period (exposure period) of the pixels 100.

At the time t4, the solid state imaging device controls the control signal pRES to High to switch the charge reset unit Tr4 to an on-state. Then, the control signal pRES is controlled back to Low. Thereby, the floating diffusion region 3 is reset. At this timing, a pixel signal immediately after the reset, which is a reference level of the pixel signal, is read out (N-reading).

At the time t5, the solid state imaging device controls the control signal pTX to High to switch the charge transfer unit Tr3 to an on-state. Then, the control signal pTX is controlled back to Low. Thereby, the signal charges held in the charge holding portion 2 are transferred to the floating diffusion region 3. A pixel signal based on the signal charges transferred to the floating diffusion region 3 is then read out (S-reading).

Figure 3:
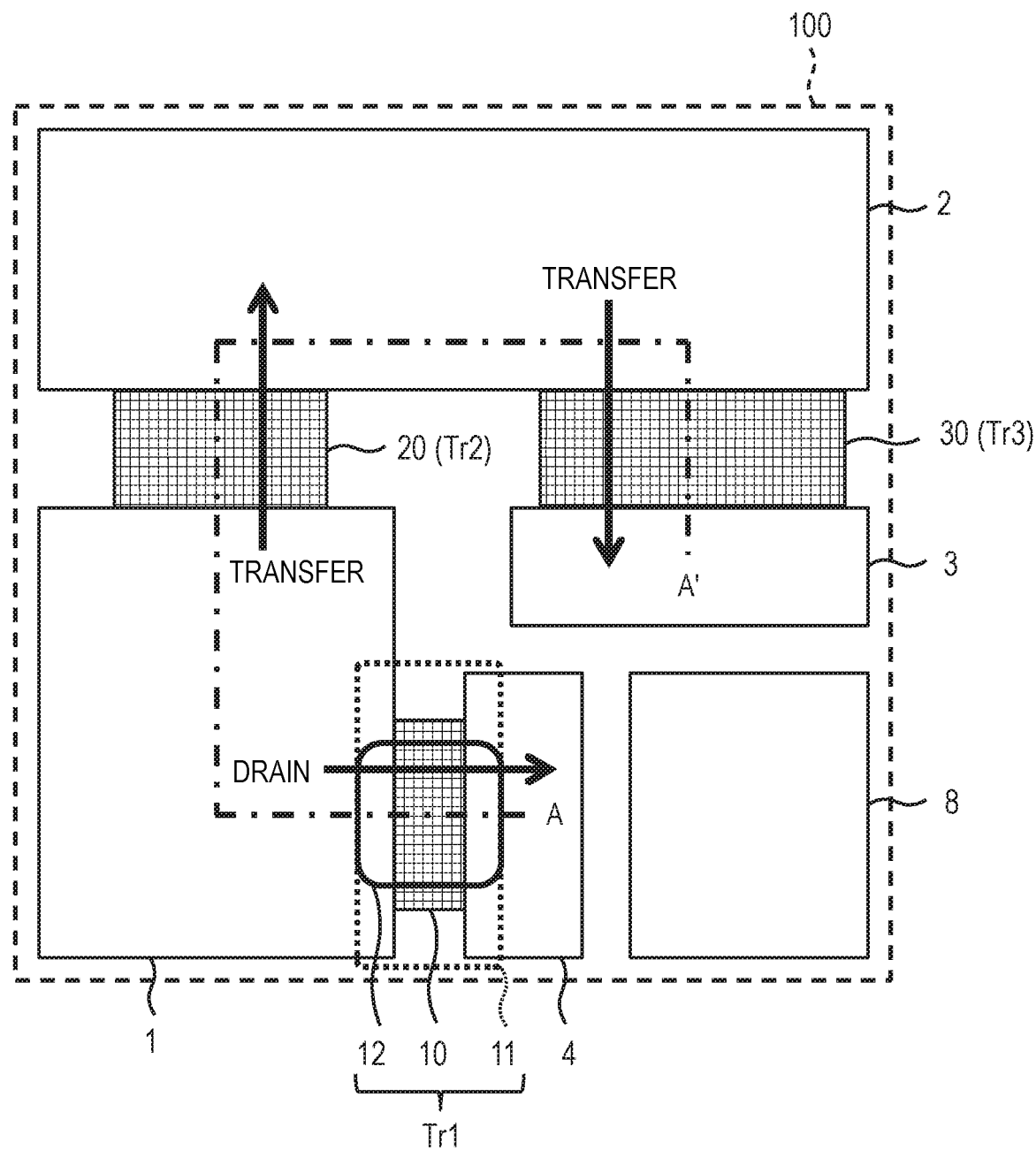
FIG. 3 is a planar view schematically illustrating the structure of the pixel in the solid state imaging device according to the first embodiment.

FIG. 3 is a planar view schematically illustrating the structure of the pixels 100 in the solid state imaging device according to the first embodiment. Identical or corresponding components to those in the previous figures are labeled with the same reference numerals. In FIG. 3, while each portion is illustrated in a rectangular shape in a simplified manner, each rectangular shape does not represent an actual form of each part but schematically illustrates a region where each portion is arranged. In the pixel transistor region 8, the charge reset unit Tr4, the amplification unit Try, the row selection unit Tr6, and the like are arranged.

The charge draining unit Tr1 and the charge transfer units Tr2 and Tr3 illustrated in FIG. 1 are configured as MOS transistors, and gate electrodes 10, 20, and 30 of respective MOS transistors are illustrated in FIG. 3. The arrows illustrated in FIG. 3 indicate the directions of transferring or draining of signal charges when the charge draining unit Tr1 and the charge transfer units Tr2 and Tr3 are switched to an on-state, respectively. In the following description, the lengths of the gate electrodes 10, 20, and 30 in the direction along the arrows illustrated in FIG. 3 may be referred to as a gate length, the widths of the gate electrodes 10, 20, and 30 in the direction orthogonal to the arrows in a planar view may be referred to as a gate width. The structure of the charge draining unit Tr1 will be described later by using FIG. 4.

Figure 4:
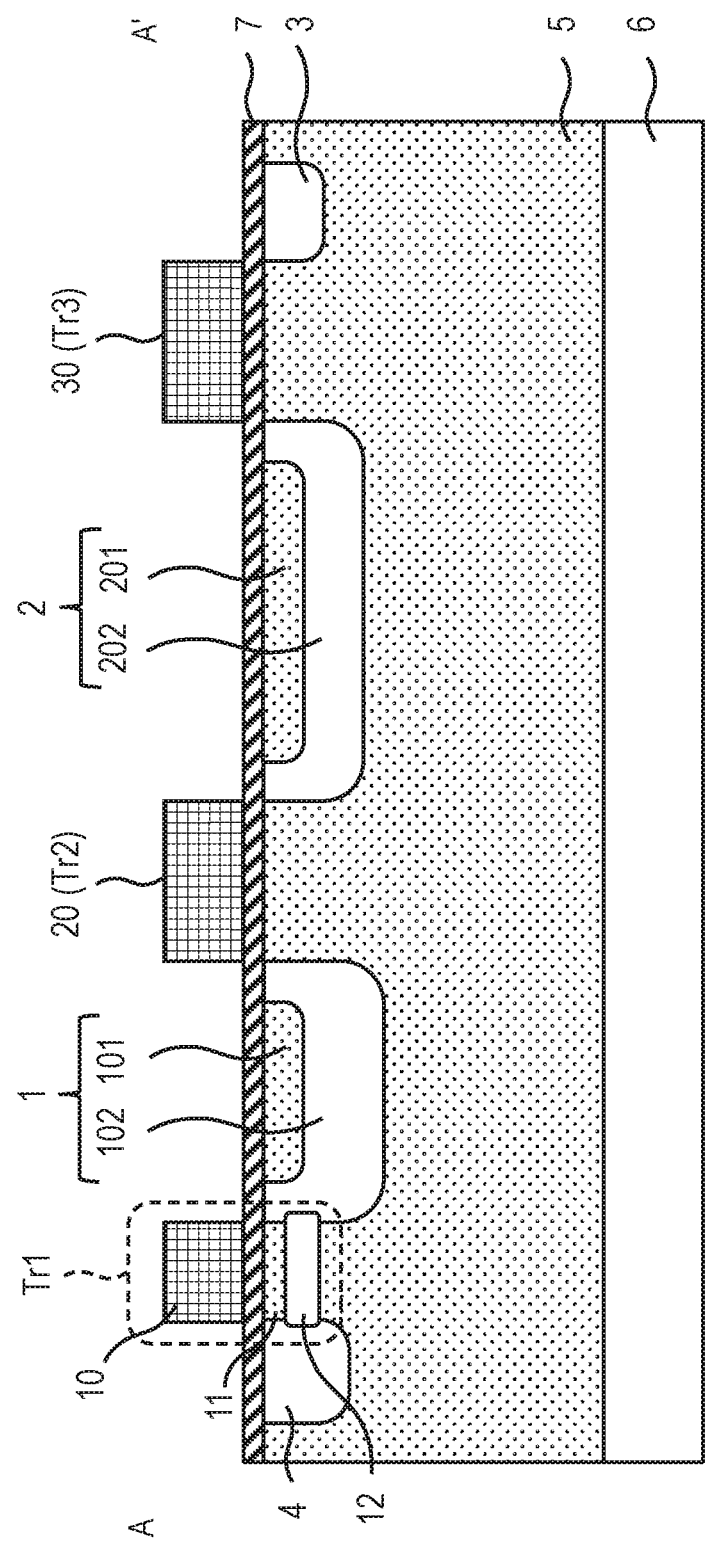
FIG. 4 is a sectional view schematically illustrating the structure of the pixel in the solid state imaging device according to the first embodiment.

FIG. 4 is a sectional view schematically illustrating the structure of the pixels 100 in the solid state imaging device according to the first embodiment. FIG. 4 illustrates a sectional view of the pixel 100 taken along a one-dot chain line A-A' illustrated in FIG. 3. Identical or corresponding components to those in the previous figures are labeled with the same reference numerals. Note that, although the signal charges are assumed as electrons in the present embodiment, the same effect can be obtained even in the case where the signal charges are assumed as holes by inverting the P-type/N-type of the semiconductor and the High/Low polarity of the control signals.

AP-type well region 5 is formed on an N-type semiconductor substrate 6. In the well region 5, each portion of the pixel 100 illustrated in FIG. 3 is formed. The photoelectric conversion unit 1 is formed of a P-type region 101 and an N-type region 102. The charge holding portion 2 is formed of a P-type region 201 and an N-type region 202. The gate electrode 20 of the charge transfer unit Tr2 is formed between the photoelectric conversion unit 1 and the charge holding portion 2. The gate electrode 30 of the charge transfer unit Tr3 is formed between the charge holding portion 2 and the floating diffusion region 3. The gate electrodes 20 and 30 are insulated from the well region 5 by an insulating layer 7.

The charge draining unit Tr1 is formed between the photoelectric conversion unit 1 and the drain region 4. The charge draining unit Tr1 includes a P-type second semiconductor region 11, an N-type first semiconductor region 12, and the gate electrode 10. The charge draining unit Tr1 in the present embodiment is formed such that the N-type first semiconductor region 12, the P-type second semiconductor region 11, the insulating layer 7, and the gate electrode 10 are stacked on the P-type well region 5 to overlap with each other in a planar view.

The first semiconductor region 12 is in contact with the N-type region 102 and the drain region 4 in the photoelectric conversion unit 1, respectively. That is, the floating diffusion region 3, the first semiconductor region 12, and the N-type region 102 in the photoelectric conversion unit 1 are connected as a continuous region of the same conductivity type (leak-path structure). The first semiconductor region 12 is formed at a deep position under the gate electrode 10 so as not to contact with the insulating layer 7. As a result, the P-type second semiconductor region 11 is formed between the gate electrode 10 and the N-type first semiconductor region 12.

In accordance with such a configuration, when the charge draining unit Tr1 is in an on-state, the signal charges accumulated in the photoelectric conversion unit 1 can be drained via a channel formed in the second semiconductor region 11 (switch structure). Further, when the charge draining unit Tr1 is in an off-state, the signal charges overflowing from the photoelectric conversion unit 1 can be drained via the first semiconductor region 12 (leak-path structure).

Figure 5A:
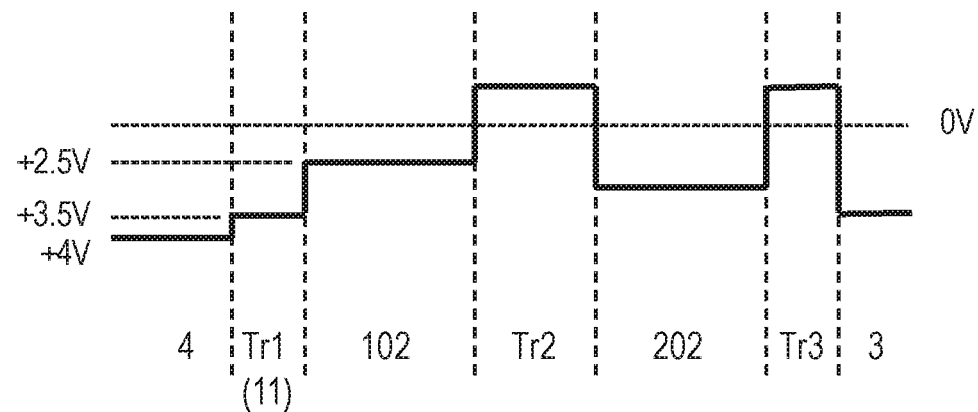
FIG. 5A and FIG. 5B are diagrams illustrating potential distributions in each portion of the pixel in the solid state imaging device according to the first embodiment.
Figure 5B:
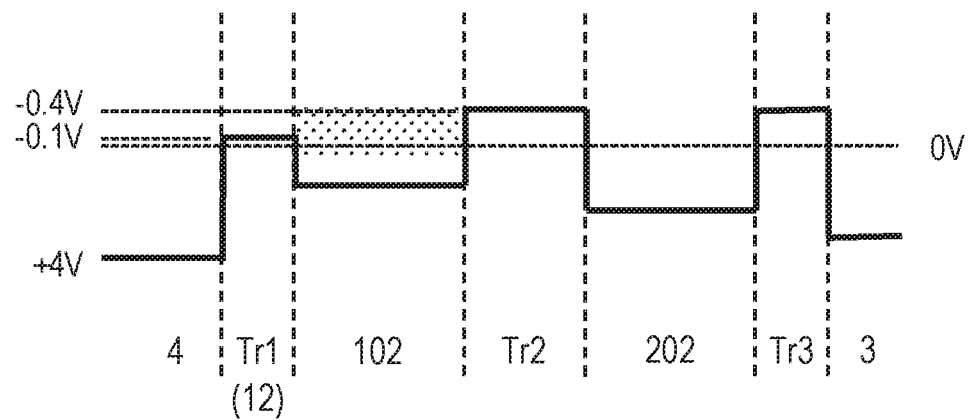

FIG. 5A and FIG. 5B are diagrams illustrating electric potential distributions in each portion of the pixel 100 in the solid state imaging device according to the first embodiment. In FIG. 5A and FIG. 5B, the electric potential in each portion of the drain region 4, the charge draining unit Tr1, the photoelectric conversion unit 1, the charge transfer unit Tr2, the charge holding portion 2, the charge transfer unit Tr3, and the floating diffusion region 3 are illustrated in order from the left. Here, the electric potentials of the N-type region 102 and N-type region 202 are indicated for the photoelectric conversion unit 1 and the charge holding portion 2, respectively, and the electric potentials in the well regions 5 under the gate electrodes 20 and 30 where the channels are formed are indicated for the charge transfer units Tr2 and Tr3. FIG. 5A and FIG. 5B illustrate that, in assumption of signal charges being electrons, the electric potential is higher for a lower part of the vertical axis. Further, FIG. 5A illustrates an electric potential distribution during charge draining, and FIG. 5B illustrates an electric potential distribution during charge accumulation. A control method of the charge draining unit Tr1 in the present embodiment will be specifically described below with reference to FIG. 5A and FIG. 5B.

First, a control method of the charge draining unit Tr1 during the charge draining period in which the signal charges are drained from the photoelectric conversion unit 1 is described with reference to FIG. 5A. In FIG. 2 above, the period t1 to t2 in which the control signal pOFG is maintained at High is a charge draining period.

When the charge draining unit Tr1 is switched to an on-state, a channel is formed in the second semiconductor region 11 under the gate electrode 10. The drain region 4 is connected to the power source 17 and maintained at a higher electric potential than the photoelectric conversion unit 1. Therefore, during the charge draining unit Tr1 being in an on-state, the signal charges accumulated in the photoelectric conversion unit 1 are drained to the drain region 4 via the channel formed in the second semiconductor region 11. The N-type region 102 of the photoelectric conversion unit 1 after signal charges are drained is in a depletion state, and the electric potential thereof is positive.

During charge draining, in order that the charge draining unit Tr1 satisfies the first requirement described above, the impurity concentration, the depth, and the planar layout in the P-type second semiconductor region 11, or the length, the width, or the like of the gate electrode 10 is an important design factor. More specifically, the first requirement in FIG.

5A is that the electric potential of the second semiconductor region 11 of the charge draining unit Tr1 is higher than the electric potential of the N-type region 102 of the photoelectric conversion unit 1 in the depletion state. For example, the pixel 100 is designed such that the electric potential of the drain region 4 is 4.0 V, the electric potential of the N-type region 102 of the photoelectric conversion unit 1 is 2.5 V, and the electric potential of the second semiconductor region 11 of the charge draining unit Tr1 during charge draining is 3.5 V.

Next, a control method of the charge draining unit Tr1 during a charge accumulation period in which signal charges are accumulated in the photoelectric conversion unit 1 is described with reference to FIG. 5B. In FIG. 2 above, the period t2 to t3 in which the control signals pOFG and pGS are both maintained at Low is a charge accumulation period.

In a charge accumulation period, it is necessary that the P-type second semiconductor region 11 of the charge draining unit Tr1 form a sufficient potential barrier in order to prevent the signal charges accumulated in the photoelectric conversion unit 1 from being drained. At the same time, it is also necessary that the second semiconductor region 11 be in a state where a sufficient amount of holes is induced and no dark current is generated. During charge accumulation, in order that the charge draining unit Tr1 satisfies these requirements, the impurity concentration, the depth, or the planar layout in the P-type second semiconductor region 11, or the length, the width, or the like of the gate electrode 10 is an important design factor. Specifically, for example, the pixel 100 is designed such that the electric potential of the second semiconductor region 11 during charge accumulation is −0.3 V.

Further, in a charge accumulation period, since signal charges accumulated in the photoelectric conversion unit 1 cause noise when overflowing to the charge holding portion 2 side, it is necessary to direct the overflowing signal charges to flow to the drain region 4 side. For this reason, the charge draining unit Tr1 in the present embodiment provides the N-type first semiconductor region 12 under the P-type second semiconductor region 11.

During charge accumulation, in order that the charge draining unit Tr1 satisfies the second requirement described above, the impurity concentration, the depth, or the planar layout in the N-type first semiconductor region 12, or the length, the width, or the like of the gate electrode 10 is an important design factor. More specifically, the second requirement in FIG. 5B is that the potential barrier of the charge draining unit Tr1 is lower than the potential barrier of the charge transfer unit Tr2. For example, the pixel 100 is designed such that the electric potential of the charge transfer unit Tr2 is −0.4 V and the electric potential of the first semiconductor region 12 of the charge draining unit Tr1 is −0.1 V.

Further, in a charge accumulation period, it is necessary that the first semiconductor region 12 form a sufficient potential barrier between the N-type region 102 of the photoelectric conversion unit 1 and the drain region 4. For this reason, the first semiconductor region 12 needs to be in the depletion state. This is because signal charges can be drained in an electrically neutral state.

Further, the potential for signal charges in the depleted first semiconductor region 12 needs to be sufficiently higher than the potential to the signal charges in the depleted N-type region 102 in the photoelectric conversion unit 1. This is because the difference between the potential in the depleted first semiconductor region 12 and the potential in the depleted N-type region 102 substantially corresponds to a saturated capacity that can accumulate signal charges in the photoelectric conversion unit 1. That is, a greater difference of the electric potential in a depletion state (depleted potential) between the first semiconductor region 12 and the N-type region 12 allows a greater signal to be handled.

To summarize the description above, during charge accumulation, it is necessary that a sufficient amount of holes be induced in the second semiconductor region 11. In addition, during charge draining and charge accumulation, it is necessary that the electric potential of each portion of the pixel 100 illustrated below be higher in the order below. The specific values of each electric potential as an example is provided in parentheses, respectively.

V1: Electric potential of the charge transfer unit Tr2 during charge accumulation (−0.4 V)
V2: Electric potential of the first semiconductor region 12 during charge accumulation (−0.1 V)
V3: Depleted electric potential of the N-type region 102 of the photoelectric conversion unit 1 (+2.5 V)
V4: Electric potential of the second semiconductor region 11 during charge draining (+3.5 V)
V5: Electric potential of the drain region 4 (+4.0 V)

Next, a preferable electric potential difference between the electric potentials V1 to V5 described above will be described. It is preferable that the electric potential V2 be higher by about 0.3 V than the electric potential V1. This electric potential difference is calculated from the light shielding performance of the charge holding portion 2 as described below. The charge holding portion 2 is generally shielded from light so as not to generate charges by photoelectric conversion. The amount of an incident light to the charge holding portion 2 is required to be −90 dB ($3.2\times10^{-3}$%) or less with respect to the amount of an incident light to the photoelectric conversion portion 1. The same criterion needs to be applied to the amount of charges overflowing from the photoelectric conversion unit 1 to the charge holding portion 2. Therefore, the amount of charges overflowing from the photoelectric conversion unit 1 to the charge holding portion 2 is required to be −90 dB or less of the total amount of charges generated in the photoelectric conversion unit 1.

The electric potential difference $\Delta V$ required to realize a ratio of the charge amount of −90 dB is calculated. In a state where the electric potential difference $\Delta V$ exists between V1 and V2, the relationship between the electron existence probability ratio $n_d$ and the electric potential difference $\Delta V$ is generally expressed by $n_d=\exp(-e\Delta V/kT)$. Here, e denotes an elementary charge, k denotes the Boltzmann constant, and T denotes an absolute temperature. From this relational expression, the electric potential difference $\Delta V$ required to realize the electron existence probability ratio $n_d$ corresponding to −90 dB is calculated to be 0.3 V.

In the present embodiment, as illustrated in FIG. 4, this electric potential difference $\Delta V$ is realized by providing the first semiconductor region 12 in the charge draining unit Tr1. The reason why it is effective to provide the first semiconductor region 12 in the charge draining unit Tr1 will be described below.

Consider that the electric potential difference $\Delta V$ of 0.3 V is realized by a configuration different from the present embodiment without providing the first semiconductor region 12 in the charge draining unit Tr1. A channel region under the gate electrode 20 where a channel is formed when the charge transfer unit Tr2 is in an on-state is in contact with the well region 5. That is, the channel region under the gate electrode 20 of the charge transfer unit Tr2 is grounded, and the Fermi level is 0 V when the charge transfer unit Tr2 is in an off-state. Similarly, when the first semiconductor region 12 is not provided in the charge draining unit Tr1, the Fermi level in a channel region under the gate electrode 10 of the charge draining unit Tr1 is 0 V when the charge draining unit Tr1 is in an off-state.

In this case, in order to realize the electric potential difference ΔV between the channel region under the gate electrode 20 and the channel region under the gate electrode 10, the P-type impurity concentration in the region under the gate electrode 20 needs to be increased and the P-type impurity concentration in the region under the gate electrode 10 needs to be reduced. The energy difference between the intermediate level Ei of the band gap and the Fermi level Ef is denoted as $kT \times \ln(p/n_i)$. Here, p denotes a net dope of the channel, and ni denotes a true carrier concentration. For example, when the P-type impurity concentration of the region under the gate electrode 10 of the charge transfer unit Tr2 is $1 \times 10^{17}$ [/cm$^3$], the required P-type impurity concentration of the second semiconductor region 11 will be $7 \times 10^{11}$ [/cm$^3$]. Given that the typical impurity concentration of a semiconductor substrate is $1 \times 10^{14}$ [/cm$^3$] and other impurity concentrations are $1 \times 10^{16}$ to $1 \times 10^{19}$ [/cm$^3$], it is not practical to control such a significantly low concentration at high accuracy.

On the other hand, when the first semiconductor region 12 is provided in the charge draining unit Tr1 as in the present embodiment, the first semiconductor region 12 is depleted, and thereby the electric potential difference ΔV of 0.3 V as the potential barrier can be easily realized. Further, by adjusting the concentration difference or the layout difference with respect to the N-type region 102 of the photoelectric conversion unit 1, the depletion electric potential of the N-type region 102 of the photoelectric conversion unit 1 can be easily reduced to the electric potential V3 or lower. For example, the N-type region 102 of the photoelectric conversion unit 1 may be an N-type region whose net dope is higher than that of the first semiconductor region 12. Further, in the present embodiment, since the P-type impurity concentration of the second semiconductor region 11 can be increased, sufficient holes can be induced in the channel region under the gate electrode 10 in the charge accumulation period, and generation of a dark current can be suppressed.

As an example, with a configuration of the pixel 100 as illustrated in the table below, a preferable electric potential difference between the electric potentials V1 to V5 as described above can be realized. Note that the gate length of the gate electrode 10 is 0.5 μm in the table below.

TABLE 1

| | Impurity | Impurity concentration [/cm$^3$] | Depth of peak concentration [μm] |
|---|---|---|---|
| Drain region 4 | Arsenic | $1.0 \times 10^{18}$ | 0.03 |
| Well region 5 | Boron | $1.0 \times 10^{15}$ | — |
| N-type semiconductor region 102 of photoelectric conversion unit 1 | Arsenic | $2.5 \times 10^{17}$ | 0.2 |
| First semiconductor region 12 | Arsenic | $1.0 \times 10^{15}$ | 0.8 |
| Second semiconductor region 11 | Boron | $1.0 \times 10^{16}$ | 0.2 |

Here, as illustrated in FIG. 3, the width of the first semiconductor region 12 in the direction perpendicular to the direction of the arrow in which signal charges are drained is preferably narrower than the width of the second semiconductor region 11 in the same direction. This is because when the first semiconductor region 12 is depleted at a position in contact with the surface of the well region 5, a dark current is generated and flows into the photoelectric conversion unit 1. Further, the width of the second semiconductor region 11 in the direction perpendicular to the direction of the arrow in which the signal charges are drained is preferably wider than the width of the gate electrode 10 in the same direction. This is because when the width of the second semiconductor region 11 is narrower than the width of the gate electrode 10, there is a concern that the channel is not completely turned off at the gate electrode 10.

Further, in the N-type first semiconductor region 12, it is preferable that the potential barrier be much larger even when the charge draining unit Tr1 is in an off-state, and there needs to be no change in at least the order of the heights of the electric potentials V1 to V5 described above. In order that the first semiconductor region 12 prevents the influence of the control signal pOFG applied to the gate electrode 10 as much as possible, it is desirable that the second semiconductor region 11 have a thickness at least 30 nm or more.

As described above, the pixel of the present embodiment has a charge accumulation region of the first conductivity type that accumulates signal charges corresponding to incident lights and a drain region of the first conductivity type to which a predetermined voltage is applied. Further, the pixel of the present embodiment has, in a planar view, a drain gate (gate electrode of the charge draining portion) located between the drain region and the charge accumulation region and a semiconductor region of the first conductivity type (first semiconductor region) connected to the charge accumulation region and the drain region. Here, the first conductivity type is one of the P-type and the N-type of a semiconductor, and the second conductivity type is the other of the P-type and the N-type of a semiconductor.

According to such a configuration, in an on-state of the charge draining unit Tr1 (state where an on-voltage is applied to the drain gate), the signal charges accumulated in the photoelectric conversion unit 1 can be drained via a channel formed in the second semiconductor region 11 (switch structure). Further, in an off-state of the charge draining unit Tr1 (state where an off-voltage is applied to the drain gate), the signal charges overflowing from the photoelectric conversion unit 1 can be drained via the first semiconductor region 12 (leak-path structure). That is, in the present embodiment, the switch structure and the leak-path structure of the charge draining unit Tr1 are formed separately, and thereby both an operation of controlling the photoelectric conversion unit 1 to the depletion state and an operation of accumulating signal charges in the photoelectric conversion unit 1 while suppressing an overflowing current to the charge holding portion 2 can be achieved. Further, generation of a dark current can be suppressed.

Second Embodiment

Figure 6:
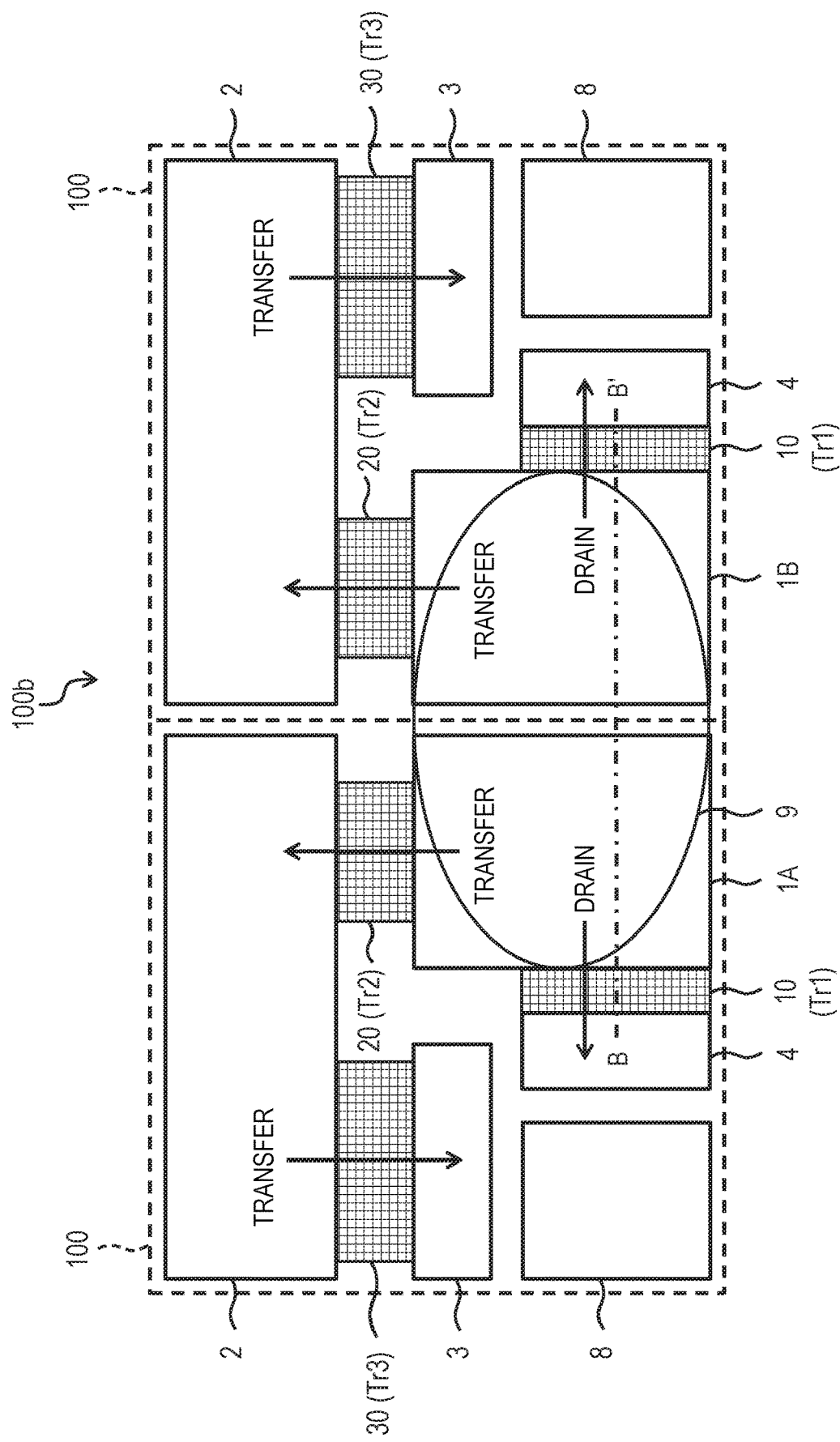
FIG. 6 is a planar view schematically illustrating the structure of a pixel in a solid state imaging device according to a second embodiment.

FIG. 6 is a planar view schematically illustrating the structure of a pixel 100b in a solid state imaging device according to a second embodiment. The pixel 100b in the present embodiment has a configuration in which two pixels 100 of the first embodiment are symmetrically arranged in a mirror image. The pixel 100b includes a pair of photoelectric conversion units 1A and 1B, and the photoelectric conversion units 1A and 1B share a micro-lens 9. This configuration enables focus detection by phase difference method by using a first pixel signal based on signal charges generated in the photoelectric conversion unit 1A and a second pixel signal based on signal charges generated in the photoelectric conversion unit 1B. The other configurations are substantially the same as those of the first embodiment above. A different configuration from the first embodiment will be described below.

Figure 7:
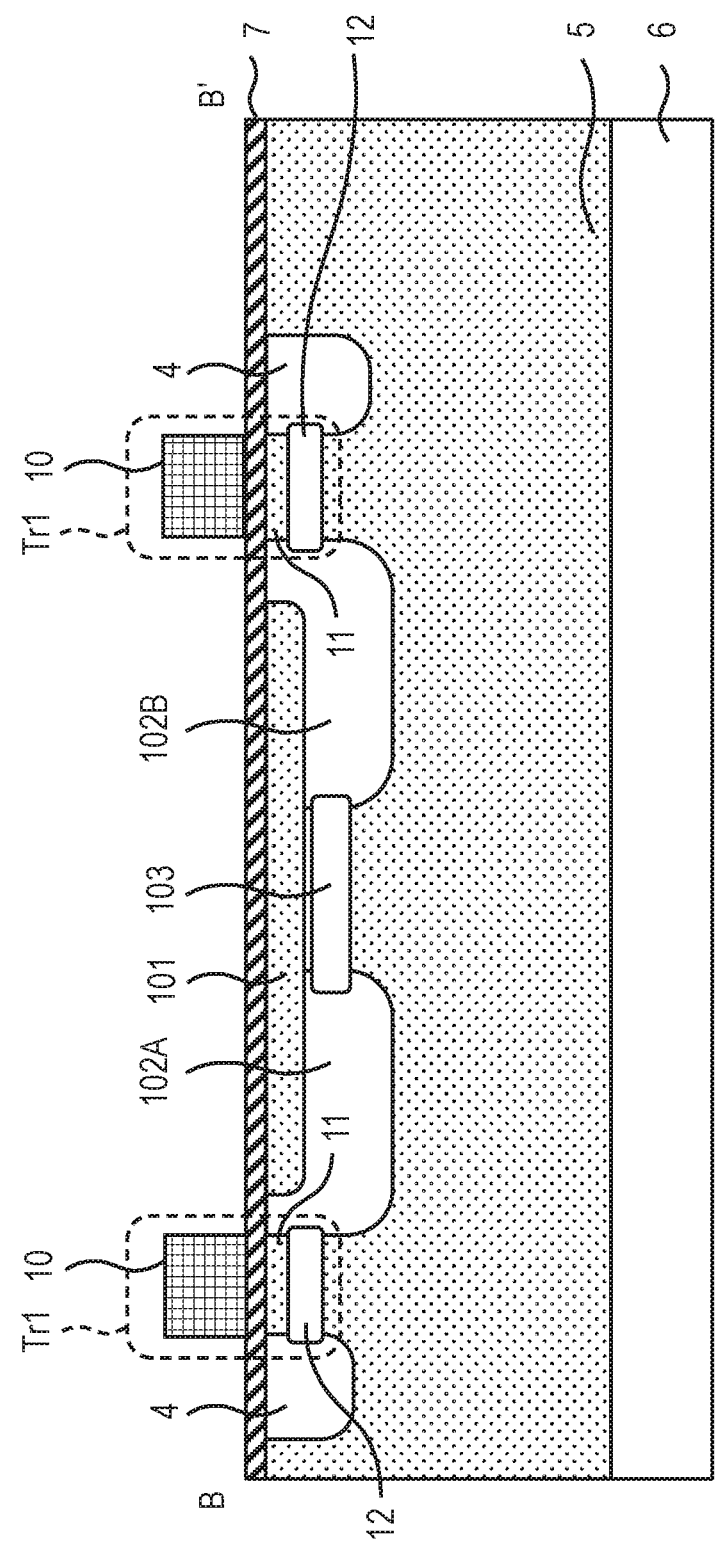
FIG. 7 is a sectional view schematically illustrating the structure of the pixel in the solid state imaging device according to the second embodiment.

FIG. 7 is a sectional view schematically illustrating the structure of the pixel 100b in the solid state imaging device according to the second embodiment. FIG. 7 illustrates a sectional view of the pixel 100b taken along a one-dot chain line B-B' illustrated in FIG. 6. Identical or corresponding components to those in the previous figures are labeled with the same reference numerals. While having separate N-type regions 102A and 102B, respectively, the pair of the photoelectric conversion units 1A and 1B share the P-type region 101. Note that the pixel 100b may have more, namely, three or more photoelectric conversion units.

In the pixel 100b in the present embodiment, the ways to which saturated signal charges accumulated in the photoelectric conversion unit 1A overflow and flow into are three ways including the drain region 4, the charge holding portion 2, and adjacent photoelectric conversion unit 1B in addition. In the present embodiment, the potential barrier of each portion is designed such that signal charges overflowing from the photoelectric conversion unit 1A is less likely to flow in the order below.
1. The N-type region 102B of the adjacent photoelectric conversion unit 1B
2. The drain region 4
3. The charge holding portion 2

A desirable order of overflow is as follows. The signal charges overflowing from the N-type region 102A of the photoelectric conversion unit 1A first flow into the N-type region 102B of the adjacent photoelectric conversion unit 1B. Then, when the signal charges accumulated in the N-type region 102B reach saturation, the overflowing signal charges next flow into the drain region 4. The amount of charges overflowing from the photoelectric conversion unit 1A to the charge holding portion 2 is preferably −90 dB or less of the total charge amount generated in the photoelectric conversion unit 1A in a similar manner to the first embodiment. The same applies to the photoelectric conversion unit 1B.

If signal charges overflowing from the N-type region 102A of the photoelectric conversion unit 1A first flow into the drain region 4 without flowing into the adjacent photoelectric conversion unit 1B, the signal charges are abandoned before the photoelectric conversion unit 1A and 1B saturate. This results in a reduced sensitivity of the pixel 100b. Further, the sensitivity varies depending on the incident angle, and this causes a reduction in the sensitivity around the pixel so-called "decrease of peripheral light quantity" or the like.

It is therefore preferable that the signal charges overflowing from the N-type region 102A of the photoelectric conversion unit 1A first flow into the N-type region 102B of the adjacent photoelectric conversion unit 1B. For this reason, the potential barrier between the photoelectric conversion unit 1A and the photoelectric conversion unit 1B is preferably lower than the potential barrier of the first semiconductor region 12 of the charge draining unit Tr1.

Accordingly, in the present embodiment, an N-type region 103 is provided between the N-type region 102A of the photoelectric conversion unit 1A and the N-type region 102B of the photoelectric conversion unit 1B. The N-type region 103 is in contact with the N-type regions 102A and the N-type region 102B, respectively. That is, the N-type region 102A, the N-type region 103, and the N-type region 102B are connected as a continuous region of the same conductivity type (leak-path structure). This configuration enables the potential barrier between the photoelectric conversion unit 1A and the photoelectric conversion unit 1B at charge accumulation to be lower than the potential barrier of the first semiconductor region 12 of the charge draining unit Tr1. As an example, in addition to the configuration of the table illustrated in the first embodiment above, such a preferable potential barrier can be realized by setting the concentration of arsenic to $1.5 \times 10^{15}$ (/cm$^3$) and the depth of the peak concentration to 0.2 μm in the N-type region 103.

As described above, the photoelectric conversion unit in the present embodiment has a pair of charge accumulation regions of a first conductivity type arranged under a semiconductor region of a second conductivity type and a third semiconductor region of the first conductivity type connected to the pair of the charge accumulation regions in the same conductivity type. Thereby, in addition to the same advantage as in the first embodiment, focus detection by a phase difference method can be performed with high accuracy without causing the decrease of peripheral light quantity. Here, the first conductivity type is one of the P-type and the N-type of a semiconductor, and the second conductivity type is the other of the P-type and the N-type of a semiconductor.

Third Embodiment

Figure 8:
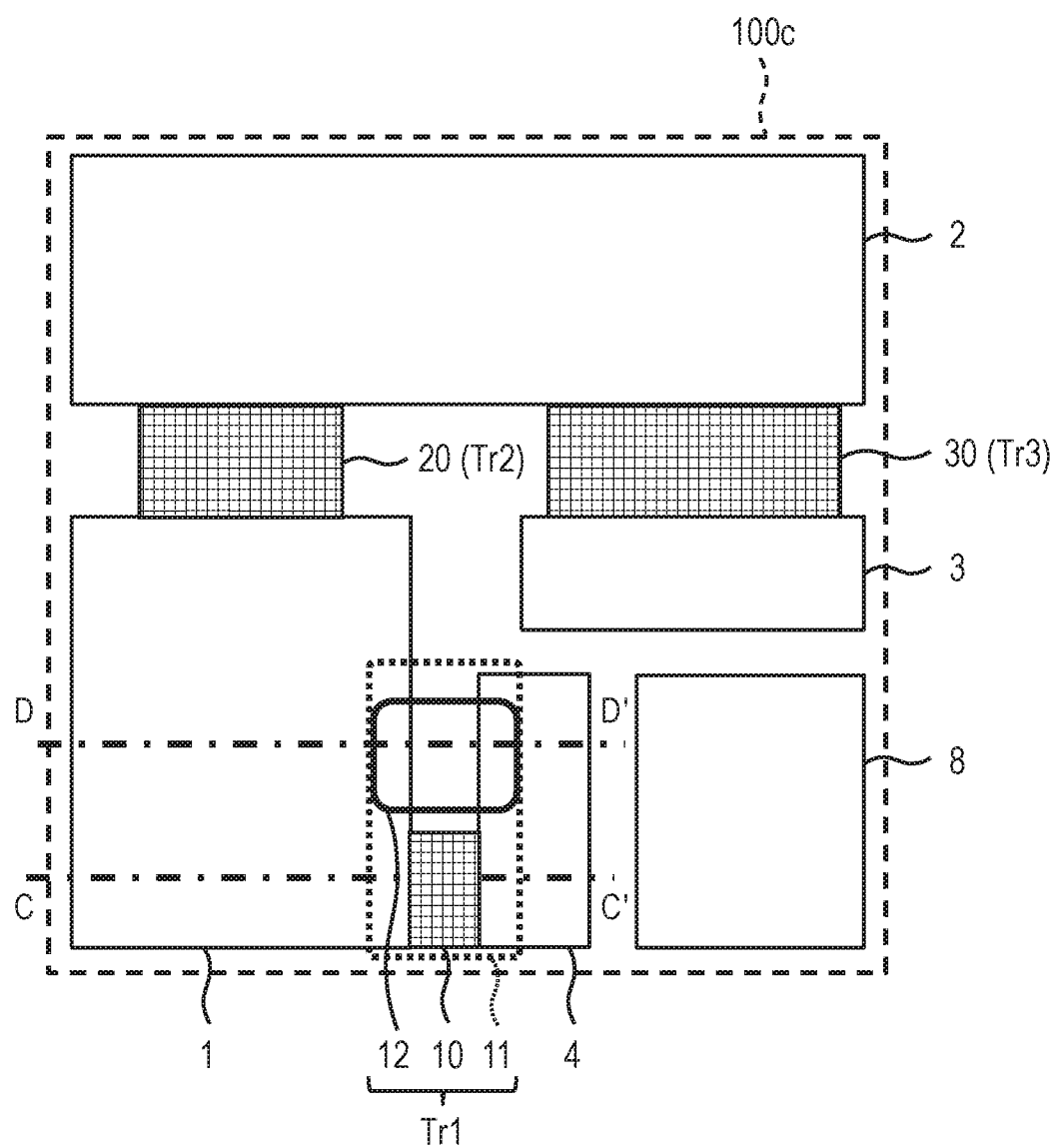
FIG. 8 is a planar view schematically illustrating the structure of a pixel in a solid state imaging device according to a third embodiment.
Figure 9A:
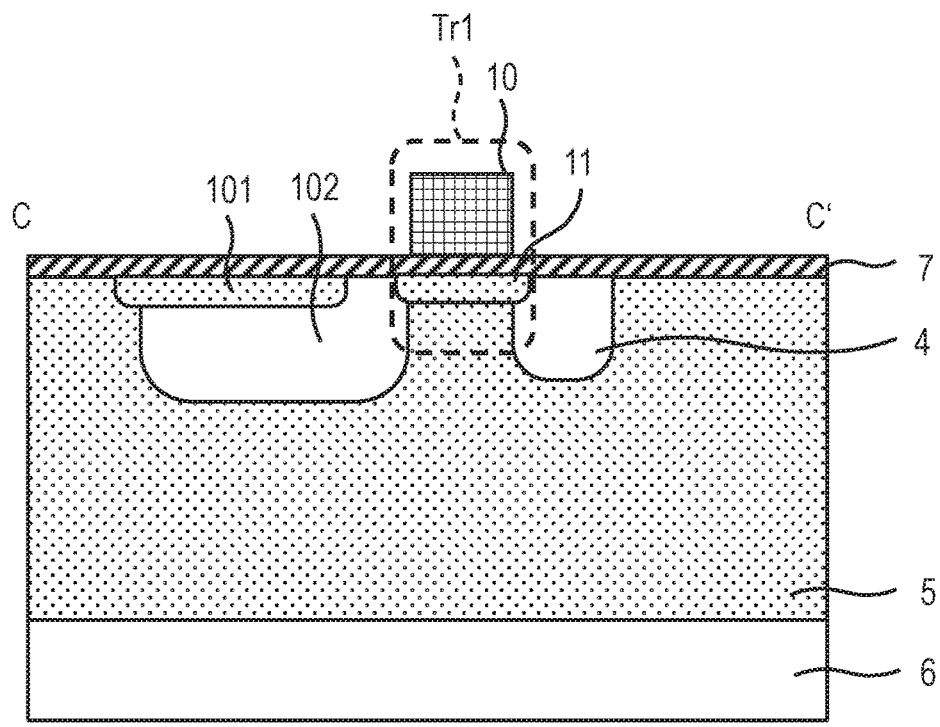
FIG. 9A and FIG. 9B are sectional views schematically illustrating the structures of the pixel in the solid state imaging device according to the third embodiment.
Figure 9B:
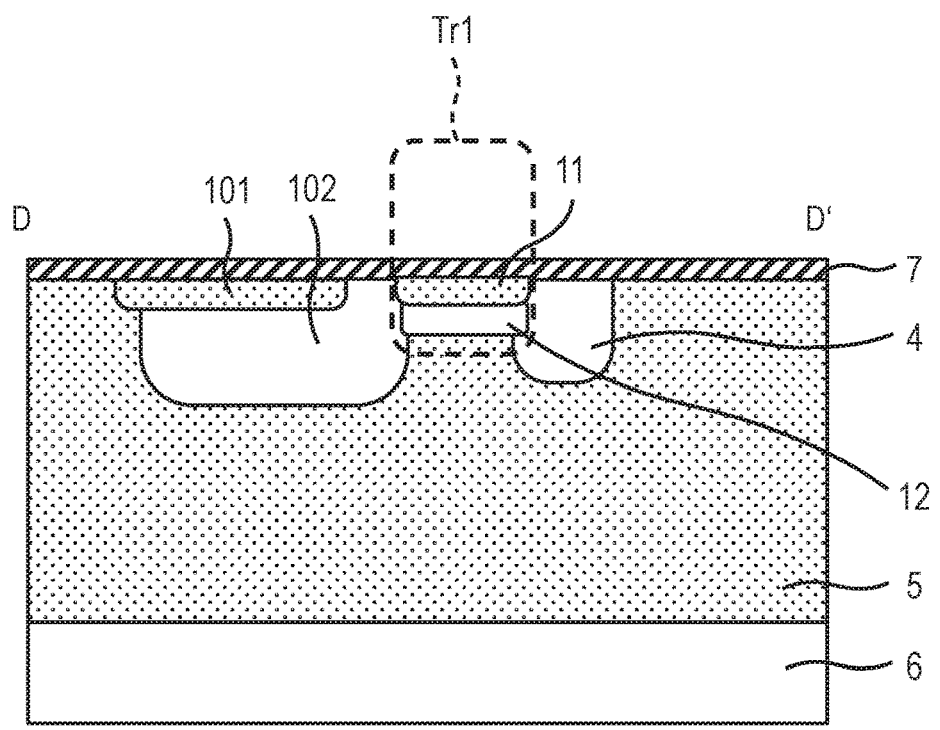

FIG. 8 is a planar view schematically illustrating the structure of a pixel 100c in a solid state imaging device according to a third embodiment. Further, FIG. 9A and FIG. 9B are sectional views schematically illustrating the structures of the pixel 100c in the solid state imaging device according to the third embodiment. FIG. 9A illustrates a sectional view of the pixel 100c taken along a one-dot chain line C-C' illustrated in FIG. 8, and FIG. 9B illustrates a sectional view of the pixel 100c taken along a one-dot chain line D-D' illustrated in FIG. 8. The charge draining unit Tr1 in the first embodiment described above is formed such that the N-type first semiconductor region 12, the P-type second semiconductor region 11, and the gate electrode 10 are stacked on the P-type well region 5 to overlap with each other in a planar view, as illustrated in FIG. 4. In contrast, as illustrated in FIG. 9A and FIG. 9B, the charge draining unit Tr1 in the present embodiment is arranged such that the N-type first semiconductor region 12 and the gate electrode 10 do not overlap with each other in a planar view.

The P-type second semiconductor region 11 is formed under the gate electrode 10 also in this configuration in a similar manner to the first embodiment described above. Further, the N-type first semiconductor region 12 is formed under the P-type second semiconductor region 11. Therefore, in a similar manner to the first embodiment, both an operation of controlling the photoelectric conversion unit 1 to a depletion state and an operation of accumulating signal charges in the photoelectric conversion unit 1 while suppressing an overflowing current to the charge holding portion 2 can be achieved. Further, generation of a dark current can be suppressed.

Further, in the charge draining unit Tr1 in the present embodiment, the leak-path structure that drains an overflowing current from the photoelectric conversion unit 1 and the switch structure that drains signal charges accumulated in the photoelectric conversion unit 1 can be juxtaposed separately. According to this configuration, although the area in a planar view increases and flexibility of layout decreases, the characteristics of the leak-path structure and the characteristics of the switch structure can be designed independently, and this significantly increases flexibility of other design.

Fourth Embodiment

Figure 10:
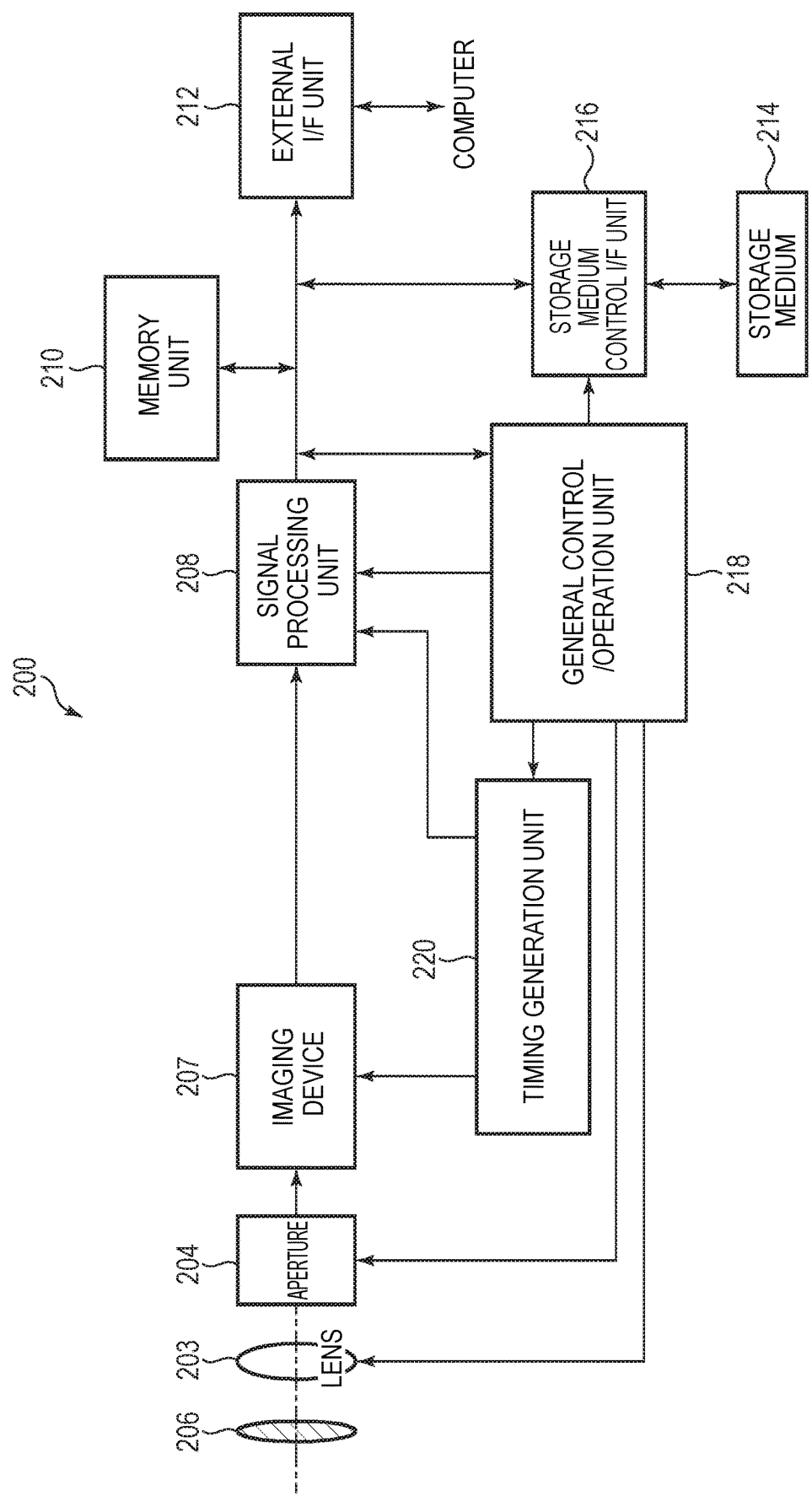
FIG. 10 is a block diagram illustrating a general configuration of an imaging system according to a forth embodiment.

An imaging system according to a fourth embodiment of the present invention will be described by using FIG. 10. FIG. 10 is a block diagram illustrating a general configuration of an imaging system according to the present embodiment.

An imaging system 200 of the present embodiment has an imaging device 207. The solid state imaging device according to any one of the configuration of the first to third embodiments described above is applied to the imaging device 207. Specific examples of the imaging system 200 may be a digital still camera, a digital camcorder, a surveillance camera, and the like.

The imaging system 200 illustrated as an example in FIG. 10 has the imaging device 207, a lens 203 that captures an optical image of a subject onto the imaging device 207, an aperture 204 for varying the amount of light passing through the lens 203, and a barrier 206 for protecting the lens 203. The lens 203 and the aperture 204 form an optical system that converges a light onto the imaging device 207.

The imaging system 200 further has a signal processing unit 208 that processes an output signal output from the imaging device 207. The signal processing unit 208 performs a signal processing operation of performing various correction and compression on an input signal for output, if necessary. For example, the signal processing unit 208 applies, to the input signal, predetermined image processing such as a conversion process for converting RGB pixel output signals to the Y, Cb, and Cr color space or gamma correction.

The imaging system 200 further has a memory unit 210 for temporarily storing image data therein and an external interface unit (external I/F unit) 212 for communicating with an external computer or the like. The imaging system 200 further has a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

The imaging system 200 further has a general control/operation unit 218 that performs various operations and controls the entire digital still camera and a timing generation unit 220 that outputs various timing signals to the imaging device 207 and the signal processing unit 208. Here, the timing signal or the like may be input from the outside, and the imaging system 200 may have at least the imaging device 207 and the signal processing unit 208 that processes an output signal output from the imaging device 207. The general control/operation unit 218 and the timing generation unit 220 may be configured to perform a part or all of the control function of the imaging device 207.

The imaging device 207 outputs an imaging signal to the signal processing unit 208. The signal processing unit 208 performs predetermined signal processing on an imaging signal output from the imaging device 207 and outputs image data. Further, the signal processing unit 208 uses an imaging signal to generate an image. An image generated by the signal processing unit 208 is stored in the storage medium 214, for example. Further, an image generated by the signal processing unit 208 is displayed as a moving image or a static image on a monitor such as a liquid crystal display. The image stored in the storage medium 214 can be hard-copied by a printer or the like.

By using the imaging device of each of the embodiments described above to configure an imaging system, it is possible to realize an imaging system that consumes less power and can acquire a better quality image.

Fifth Embodiment

Figure 11A:
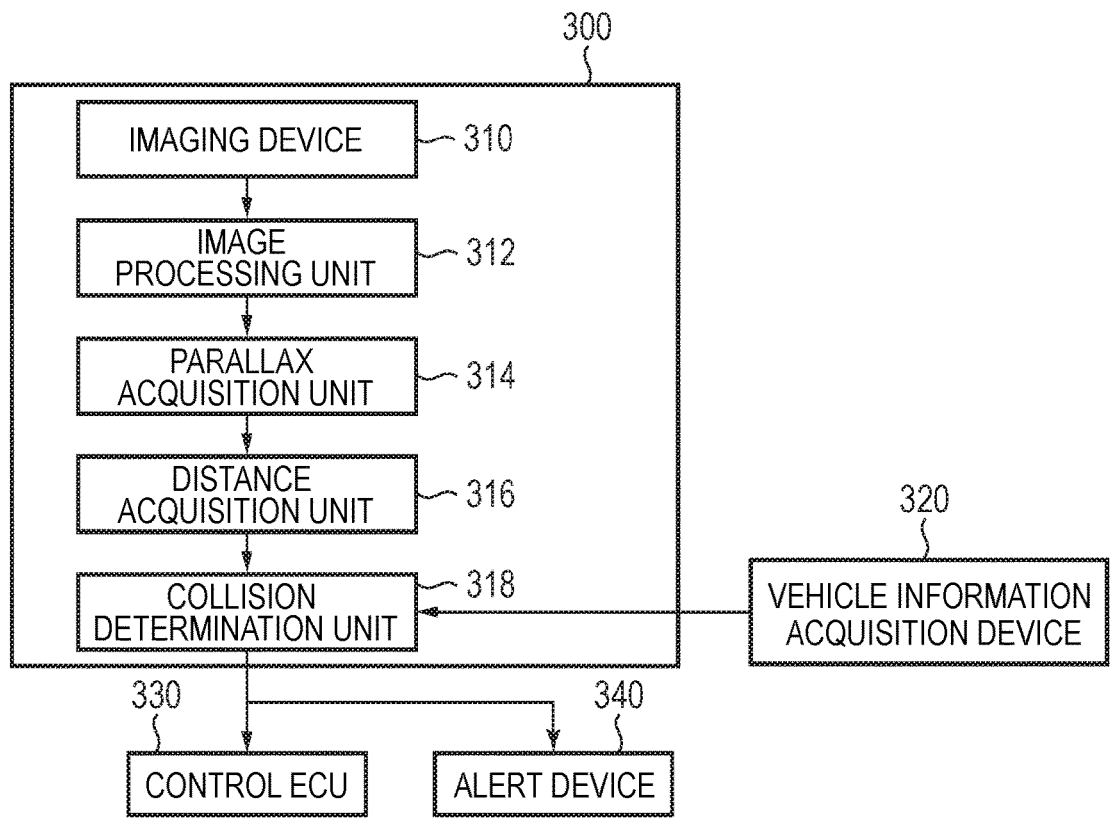
FIG. 11A and FIG. 11B are diagrams illustrating a configuration example of an imaging system and a mobile apparatus according to a fifth embodiment.
Figure 11B:
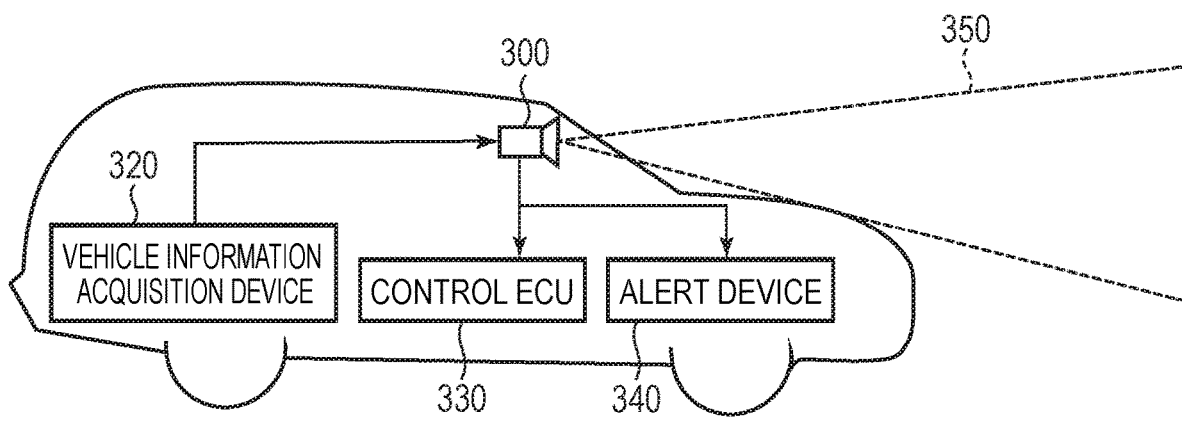

An imaging system and a mobile apparatus according to a fifth embodiment of the present invention will be described by using FIG. 11A and FIG. 11B. FIG. 11A and FIG. 11B are diagrams illustrating a configuration of an imaging system and a mobile apparatus according to the present embodiment.

FIG. 11A illustrates an example of an imaging system 300 related to an on-vehicle camera. The imaging system 300 has an imaging device 310. The imaging device 310 is any of the imaging devices 207 according to each embodiment described above. The imaging system 300 has an image processing unit 312 that performs image processing on a plurality of image data acquired by the imaging device 310 and a parallax acquisition unit 314 that calculates a parallax (a phase difference of parallax images) from the plurality of image data acquired by the imaging device 310. Further, the imaging system 300 has a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. That is, the control ECU 330 is an example of a mobile apparatus control unit that controls a mobile apparatus based on the distance information. Further, the imaging system 300 is also connected to an alert device 340 that alerts the driver based on a determination result by the collision determination unit 318. For example, when the collision determination unit 318 determines high collision probability, the control ECU 330 performs vehicle control to avoid a collision or reduce damage by braking, releasing the accelerator, suppressing engine power, or the like. The alert device 340 alerts a user by sounding an alarm sound or the like, displaying alert information on a display of an automotive navigation system or the like, providing vibration to a seat belt or a steering wheel, or the like.

In the present embodiment, an area around a vehicle, for example, a front area or a rear area is captured by using the imaging system 300. FIG. 11B illustrates the imaging system 300 in a case of capturing a front area of a vehicle (a capturing area 350). The vehicle information acquisition device 320 transmits an instruction to operate the imaging system 300 to perform capturing an image. By using the imaging device 207 of each embodiment described above as the imaging device 310, the imaging system 300 of the present embodiment can further improve the ranging accuracy.

Although the example of control for avoiding a collision to another vehicle has been described above, the embodiment is applicable to automatic driving control for following another vehicle, automatic driving control for lane keeping, or the like. Furthermore, the imaging system is not limited to a vehicle such as the subject vehicle and can be applied to a mobile apparatus (moving apparatus) such as a ship, an airplane, or an industrial robot, for example. In addition, the imaging system can be widely applied to a device which utilizes object recognition, such as an intelligent transportation system (ITS), without being limited to mobile apparatuses.

Modified Embodiments

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is one of the embodiments of the present invention.

Further, the imaging systems illustrated in the fourth and fifth embodiments are examples of an imaging system to which the solid state imaging device of the present invention can be applied as the imaging device 207, and an imaging system to which the solid state imaging device of the present invention can be applied is not limited to the configuration illustrated in FIG. 10 and FIGS. 11A and 11B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-146694, filed Jul. 28, 2017, which is hereby incorporated by reference herein in its entirety.

What is claimed is:

1. A solid state imaging device comprising a plurality of pixels, wherein each of the pixels comprises:
   a charge accumulation region of a first conductivity type that accumulates signal charges corresponding to an incident light;
   an amplification transistor configured to amplify the signal charges;
   a transfer gate configured to transfer the signal charges from the charge accumulation region to an input node of the amplification transistor;
   a reset gate configured to reset the input node of the amplification transistor;
   a drain region of the first conductivity type to which a predetermined voltage is applied;
   a drain gate located between the drain region and the charge accumulation region in a planar view; and
   a semiconductor region of the first conductivity type connected to the charge accumulation region and the drain region.

2. An imaging system comprising:
   the solid state imaging device according to claim 1; and
   a signal processing unit configured to process a signal output from the solid state imaging device.

3. A mobile apparatus comprising:
   an imaging device to which the solid state imaging device according to claim 1 is applied;
   a distance information acquisition unit configured to acquire distance information on a distance to an object from a parallax image based on a signal from the imaging device; and
   a control unit configured to control the mobile apparatus based on the distance information.

4. A solid state imaging device comprising a plurality of pixels, wherein each of the pixels comprises:
   a charge accumulation region of a first conductivity type that accumulates signal charges corresponding to an incident light;
   a drain region of the first conductivity type to which a predetermined voltage is applied;
   a drain gate located between the drain region and the charge accumulation region in a planar view; and
   a semiconductor region of the first conductivity type connected to the charge accumulation region and the drain region,
   wherein each of the pixels has a second semiconductor region of a second conductivity type arranged under the drain gate with an insulating layer being interposed between the second semiconductor region and the drain gate,
   wherein the signal charges accumulated in the charge accumulation region are drained via the second semiconductor region in a state where an on-voltage is applied to the drain gate, and
   wherein the signal charges overflowing from the charge accumulation region are drained via the semiconductor region in a state where an off-voltage is applied to the drain gate.

5. The solid state imaging device according to claim 4, wherein the semiconductor region and the drain gate overlap with each other in a planar view.

6. The solid state imaging device according to claim 5, wherein a width of the semiconductor region in a direction perpendicular to a direction in which the signal charges are drained is narrower than a width of the second semiconductor region in the same direction in a planar view.

7. The solid state imaging device according to claim 5, wherein a width of the second semiconductor region in a direction perpendicular to a direction in which the signal charges are drained is wider than a width of the drain gate in the same direction in a planar view.

8. The solid state imaging device according to claim 4, wherein the semiconductor region and the drain gate do not overlap with each other in a planar view.

9. The solid state imaging device according to claim 4, wherein the pixel includes a photoelectric conversion unit configured to convert an incident light to the signal charges and configured to accumulate the converted signal charges in the charge accumulation region, and
   wherein the photoelectric conversion unit includes a plurality of the charge accumulation regions.

10. The solid state imaging device according to claim 9, wherein the photoelectric conversion unit includes a third semiconductor region of the first conductivity type connected to a pair of the charge accumulation regions of the first conductivity type in the same conductivity type.

11. The solid state imaging device according to claim 4, wherein the semiconductor region is depleted.

12. The solid state imaging device according to claim 4, wherein an impurity concentration of the first conductivity type in the semiconductor region is lower than an impurity concentration of the first conductivity type in the charge accumulation region and the drain region.

13. The solid state imaging device according to claim 4, wherein the second semiconductor region has a thickness of 30 nm or greater.

14. The solid state imaging device according to claim 4, wherein, in a state where an on-voltage is applied to the drain gate, a potential in the second semiconductor region is lower than a potential in the charge accumulation region in a depletion state.

15. The solid state imaging device according to claim 4,
wherein the pixel has a charge transfer unit configured to transfer the signal charges from the charge accumulation region to a charge holding portion, and
wherein, in a state where an off-voltage is applied to the drain gate, a potential in the semiconductor region is lower than a potential in the charge transfer unit.

16. The solid state imaging device according to claim 10, wherein, in a state where an on-voltage is applied to the drain gate, a potential in the third semiconductor region is lower than a potential in the semiconductor region.

* * * * *